United States Patent [19]

Bulzachelli

[11] Patent Number: 5,036,298
[45] Date of Patent: Jul. 30, 1991

[54] CLOCK RECOVERY CIRCUIT WITHOUT JITTER PEAKING

[75] Inventor: John F. Bulzachelli, Arlington, Mass.

[73] Assignee: Analog Devices, Inc., Norwood, Mass.

[21] Appl. No.: 514,748

[22] Filed: Apr. 26, 1990

[51] Int. Cl.[5] .............................................. H03L 7/00
[52] U.S. Cl. ...................................... 331/23; 331/25; 329/325
[58] Field of Search ............................ 331/18, 23, 25; 329/318, 319, 325

[56] References Cited

U.S. PATENT DOCUMENTS 4,744,096 5/1988 Roux .................................... 375/120
4,890,071 12/1989 Curtis .................................. 315/25 X

OTHER PUBLICATIONS

Trischitta, P. R. and Varma, E. L. *Jitter in Digital Transmission Systems* (Artech House, Norwood, MA 1989) Chapter 3, pp. 49–82.

*Primary Examiner*—Robert J. Pascal
*Attorney, Agent, or Firm*—Wolf, Greenfield & Sacks

[57] ABSTRACT

A voltage-controlled delay is connected in series with a phase-locked loop. The voltage-controlled delay is controlled by the control voltage developed by the phase-locked loop amplifier and filter. With this arrangement, the amplifier and filter can be designed to have a transfer function that does not include an explicit zero. Consequently, the jitter transfer function of the overall structure can be designed to remain equal to or less than unity over all frequencies and jitter peaking is eliminated.

17 Claims, 3 Drawing Sheets

CLOCK RECOVERY CIRCUIT WITHOUT JITTER PEAKING

FIELD OF THE INVENTION

This invention relates to clock recovery circuits and, in particular, to clock recovery circuits which utilize a phase-locked loop to regenerate a clock signal.

BACKGROUND OF THE INVENTION

A digital data stream that has passed through a distorting and noisy transmission channel must often be re-timed or regenerated so that it can be accurately decoded. If the transmission covers long distances, often the regeneration procedure must be performed several times. Alternatively, data which has an embedded clock signal must have the clock signal recovered before the data can be decoded.

For those digital signals which have an express or implied clock frequency, the conventional digital receiver or repeater circuits that regenerate the signal typically recover the clock signal and use the recovered signal to retime the data. The circuits that recover the clock signal from the incoming data are known as clock synchronizers and often use a phase-locked loop to control a local oscillator operating at the clock signal frequency.

A conventional phase-locked loop contains three components: a phase detector, a loop amplifier and filter, and a voltage-controlled oscillator (VCO), whose frequency is controlled by a control voltage. The phase detector compares the phase of an incoming data signal against the phase of the VCO and produces an output which is a measure of the phase difference between its two inputs. The phase detector output is then amplified and filtered by the loop amplifier and filter and applied to the VCO as a control voltage. The control voltage is applied to the VCO in such a manner that it reduces the phase difference between the input signal and the VCO.

When the loop is in a "locked" condition, the control voltage produced by the loop amplifier and filter is such that the oscillation frequency of the VCO is substantially equal to the bit rate of the input signal and, thus, the clock signal can be regenerated from the VCO output. However, due to the finite bandwidth of the phase-locked loop, the output of the VCO will not perfectly track variations in the input producing a time-varying phase tracking error. It is desirable to design the phase-locked loop to maximize tracking and, consequently, to minimize this tracking error.

It is possible to improve tracking by increasing the loop bandwidth, but if this is done another problem is exacerbated. In a typical input signal, the phase of the express or implied clock signal is not absolutely constant but also is subject to a time variance or "jitter". Since the incoming data is retimed by using the VCO output, it is desirable that the loop not track the jitter of the incoming data so that input phase jitter can be reduced at the output. The output jitter divided by the input jitter is known as the "jitter transfer function" of the circuit. This transfer function has a "low pass" characteristic and it is generally desirable to make the cut-off frequency as low as possible. The cut-off frequency of the jitter transfer function can be reduced by reducing the loop bandwidth, but this action decreases the loop tracking. Consequently, prior art clock recovery circuits are generally compromises.

Further, in a conventional phase-locked loop, in order to insure that the loop-induced phase error is driven as close as possible to zero, the loop amplifier and filter usually includes an integrator. Additional circuitry is generally added to the integrator so that the amplifier and filter has a transfer function (in accordance with standard Laplace transform notation) with an explicit zero which is necessary for stabilizing the phase-locked loop. However, the presence of the zero in the amplifier and filter transfer function creates a problem called "jitter peaking." This latter problem results from the fact that, due to the zero, the closed loop jitter transfer function of the phase-locked loop exceeds unity within a band of frequencies. The incoming signal jitter is then amplified at these frequencies, producing more jitter at the output. The jitter peaking problem is especially severe if, as previous mentioned, regenerators must be cascaded in a long-distance digital communication system. In this case, jitter noise is increased by each regenerator so that the noise accumulates exponentially, as discussed in the reference titled "Jitter In Digital Transmission Systems", P. Trischitta and E. Varma, Chapter 3, Artech House, 1989.

Accordingly, it is an object of the present invention to provide a clock recovery circuit in which jitter peaking is eliminated.

It is a further object of the present invention to provide a clock recovery circuit in which the explicit zero normally found in the transfer function of the loop amplifier and filter can be eliminated without effecting the stability of the loop.

It is a further object of the present invention to provide a clock recovery circuit in which phase-locked loop components can be selected such that the jitter transfer function never exceeds unity.

SUMMARY OF THE INVENTION

The foregoing objects are achieved and the foregoing problems are solved in one illustrative embodiment of the invention in which a delay element is placed in the incoming data stream ahead of the phase-locked loop. The delay element is controlled by the control voltage developed by the phase-locked loop amplifier and filter. With this structure, an explicit zero in the transfer function of the loop amplifier and filter is no longer needed to stabilize the loop. More particularly, the closed-loop transfer function of the inventive circuit has the same poles as the traditional phase-locked loop circuit and, consequently, the same stability. Without the explicit zero, there is no frequency at which the jitter transfer function exceeds unity and, hence, "jitter peaking" is eliminated.

DETAILED DESCRIPTION OF THE PREFERRED EMBODIMENT

Figure 1:
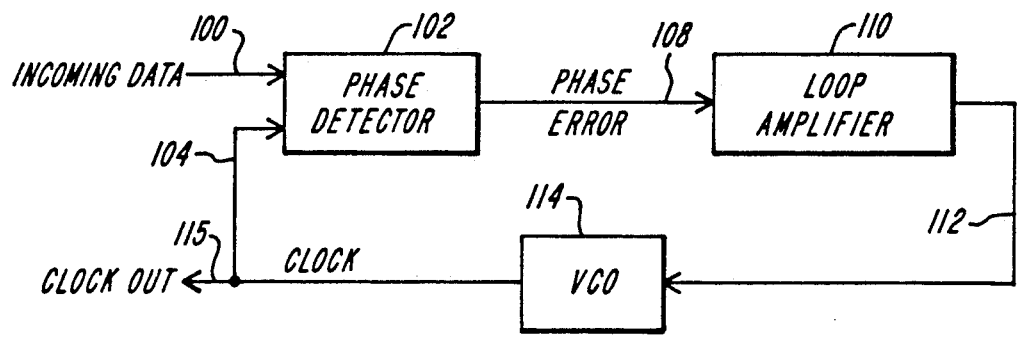
FIG. 1 is a block diagram of a conventional phase-locked loop.

A typical phase-locked loop suitable for clock recovery purposes is shown in FIG. 1. Incoming data on line 100 enters a phase detector 102. Phase detector 102 receives another input on line 104 which input is a clock signal developed by voltage-controlled oscillator (VCO) 114 on line 115. Phase detector 102 compares the phase of the clock signal on line 104 to that of the data on line 100 and develops a phase error signal on line 108 which error signal is indicative of the difference in phase between the clock signal and the incoming data. The phase error signal on line 108 is provided to a loop amplifier and filter 110 which develops a control voltage 112 that is used to adjust the output of VCO 114 so that the phase error detected by phase detector 102 is reduced to zero. The incoming data on line 100 can then be re-timed by conventional circuitry (not shown).

Figure 2:
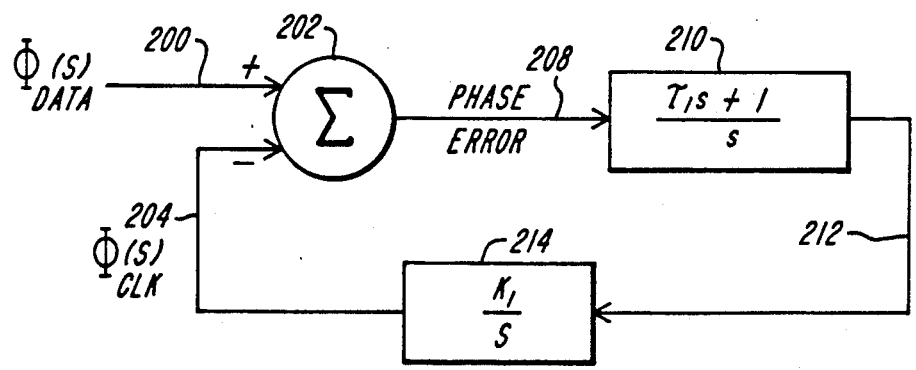
FIG. 2 is a linearized block diagram for the phase-locked loop shown in FIG. 1 used for analysis purposes.

FIG. 2 of the drawing shows a linearized block diagram of the phase-locked loop shown in FIG. 1. Corresponding elements in FIGS. 1 and 2 are given similar numeral designations. For example, VCO 114 in FIG. 1 corresponds to VCO 214 in FIG. 2, etc. In accordance with conventional network theory, phase detector 102 is represented by a summer 202. As previously mentioned, in order to insure that the phase error is driven to zero, loop amplifier and filter 110 includes an integrator plus other conventional circuitry so that the transfer function of the amplifier and filter circuit 110 contains an explicit zero necessary for loop stability. VCO 114 is represented by the function $K/s$ in block 214.

A straightforward feedback analysis of the linearized circuit shown in FIG. 2 indicates that the jitter transfer function of the loop is:

$$\frac{\Phi_{clk}(s)}{\Phi_{data}(s)} = \frac{K_1(1 + \tau_1 s)}{s^2 + K_1 \tau_1 s + K_1} \quad (1)$$

Where, conventionally, $K_1$ is the product of the phase detector gain, the loop amplifier and filter gain and the VCO gain and $\tau_1$ is the time constant of the explicit zero in the loop amplifier and filter.

Figure 3:
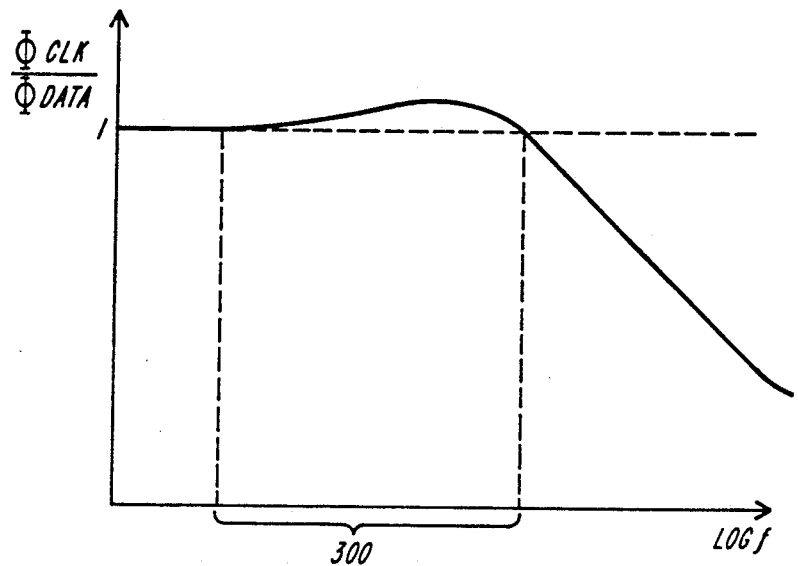
FIG. 3 is a plot of the jitter transfer function of the phase-locked loop shown in FIG. 1 as a function of log frequency.

It is possible to show that the jitter transfer function in expression (1) exceeds unity in at least one frequency band as shown in frequency band 300 in the plot of the jitter transfer function vs log frequency in FIG. 3. This phenomenon is the cause of "jitter peaking" as mentioned above. For phase-locked loops that are cascaded, the "jitter peaking" is multiplicitive and, thus, becomes a serious problem.

Figure 4:
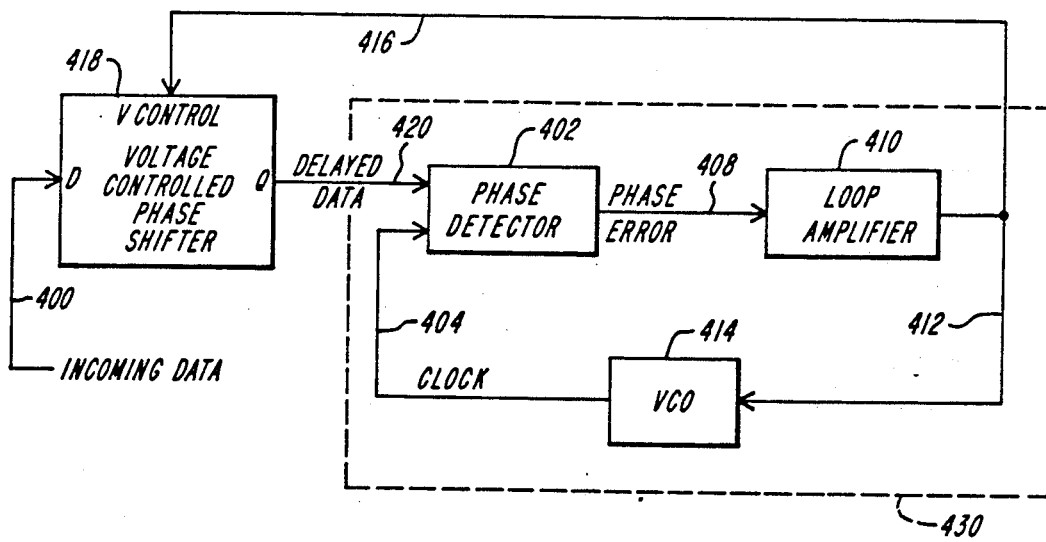
FIG. 4 is a block diagram of the inventive phase-locked loop architecture.

FIG. 4 of the drawing shows improved phase-locked loop architecture in accordance with the principles of the present invention which eliminates the problem of "jitter peaking." The circuit consists of a phase-locked loop 430 which is essentially equivalent to that shown in FIG. 1. It includes a phase detector 402, loop amplifier and filter 410 and VCO 414. Equivalent parts in the loop shown in FIG. 4, which correspond to those shown in FIG. 1, have similar numerals (for example, VCO 114 corresponds to VCO 414).

The conventional phase-locked loop architecture has been modified, however, by the addition of a voltage-controlled phase-shifter 418 in series with the incoming data stream. Incoming data on line 400 is provided to phase-shifter 418 which develops a delayed data stream 420 wherein the delay is proportional to a control voltage provided on line 416. The delayed data 420 is then provided as the input data to phase-locked loop 430. The control voltage on line 416 is developed by the loop amplifier and filter 410 and is the same voltage applied to VCO 414 via line 412.

As in the phase-locked loop shown in FIG. 1, loop amplifier and filter 410 includes an integrator so that the static (or D.C.) component of the phase error is reduced to zero. However, an explicit transfer function zero in the loop amplifier and filter is no longer necessary because phase shifter 418 stabilizes the loop.

Figure 5:
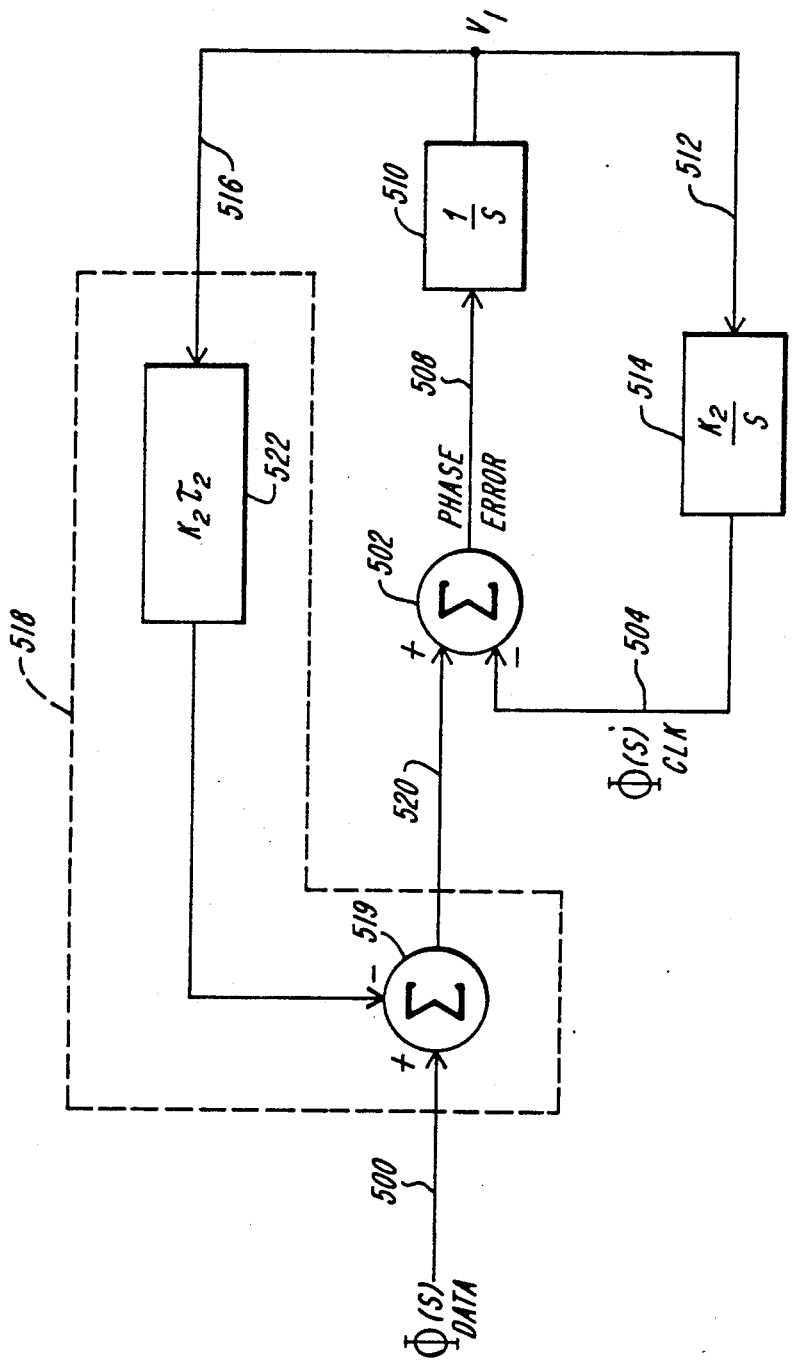
FIG. 5 is a linearized block diagram of the phase-locked loop shown in FIG. 4 used for evaluation purposes.

More particularly, a linearized block diagram for the phase-locked loop system of FIG. 4 is shown in FIG. 5. The voltage-controlled phase shifter 418 is represented by a gain block 522 in series with a summer 519. It should also be noticed that the loop amplifier and filter 410 is represented by simple integrator 510 which does not include an explicit zero.

From the diagram in FIG. 5, it can be shown that the two following relationships hold with respect to the control voltage $v_1$:

$$\Phi_{data} - K_2 \tau_2 v_1 - \Phi_{clk} = sv_1 \quad (2)$$

$$\Phi_{clk} = v_1 K_2/s \quad (3)$$

where $K_2$ is the product of the phase detector gain, the loop amplifier and filter gain and the VCO gain and $\tau_2$ is the ratio of the phase shifter gain to the VCO gain.

Eliminating $v_1$, the jitter transfer function is as follows:

$$\frac{\Phi_{clk}(s)}{\Phi_{data}(s)} = \frac{K_2}{s^2 + K_2 \tau_2 s + K_2} \quad (4)$$

A comparison of jitter transfer functions in expressions (1) and (4) shows that the FIG. 4 architecture has the same poles as the traditional FIG. 1 architecture and, consequently, the loop stability is the same. However, the FIG. 4 configuration does not have the explicit zero. Thus, it is possible to assign values to $K_2$ and $\tau_2$ such that the loop has a damping ratio ($\zeta$) greater than 0.707 and the jitter transfer function remains equal to or less than unity at all frequencies. Hence, "jitter peaking" is eliminated.

Further, the aforementioned compromise between loop tracking and input jitter reduction which was necessary in prior art circuits is also eliminated. In particular, the phase error between the delayed data on line 418 and the VCO output on line 404 can be minimized by delay element 418, but input jitter is not added to the VCO clock output.

Although only illustrative embodiment has been shown in the above description, other modifications and changes will be immediately apparent to those skilled in the art. For example, although the invention has been discussed with respect to a digital incoming data stream, the inventive architecture can also be used with an analog circuit to recover an express or implied carrier signal. In this latter case, both the voltage-controlled delay and the phase locked loop would be analog circuits in accordance with conventional designs. These changes and modifications are intended to be covered by the following claims.

What is claimed is:

1. Phase-locked loop signal recovery apparatus for recovering a periodic signal from an incoming data stream, said signal recovery apparatus comprising:

means responsive to a control signal for generating a variable-frequency periodic signal;

delay means responsive to said control signal for selectively delaying said incoming data stream to generate a delayed data stream; and means responsive to said delayed data stream and to said variable-frequency periodic signal for generating said control signal, said control signal being indicative of the phase difference between said delayed data stream and said variable frequency periodic signal.

2. Phase-locked loop signal recovery apparatus according to claim 1 wherein said delay means comprises a voltage-controlled phase shifter.

3. Phase-locked loop signal recovery apparatus according to claim 1 wherein said control signal generating means comprises a phase detector and a filter means with a transfer function that does not include an explicit zero.

4. Phase-locked loop signal recovery apparatus according to claim 3 wherein said filter means comprises an integrator.

5. Phase-locked loop signal recovery apparatus according to claim 1 wherein said variable-frequency periodic signal generating means comprises a voltage-controlled oscillator.

6. Phase-locked loop signal recovery apparatus according to claim 1 wherein said delay means comprises:
a gain block responsive to said control signal for producing a delayed control signal; and
a summer receiving the delayed control signal and the data stream to generate the delayed data stream.

7. Phase-locked loop clock recovery apparatus for recovering a clock signal from an incoming digital data stream, said clock recovery apparatus comprising:
a voltage-controlled oscillator responsive to a voltage control signal for generating a variable-frequency clock signal;
delay means responsive to said voltage control signal for selectively delaying said digital data stream to generate a delayed data stream; and
means responsive to said delayed data stream and to said clock signal for generating said voltage control signal.

8. Phase-locked loop clock recovery apparatus according to claim 7 wherein said voltage control signal generating means comprises a phase detector and a filter means with a transfer function that does not include an explicit zero.

9. Phase-locked loop recovery apparatus according to claim 6 wherein said filter means comprises an integrator.

10. Phase-locked loop recovery apparatus according to claim 5 wherein said delay means comprises a voltage-controlled phase shifter.

11. Phase-locked loop clock recovery apparatus for recovering a clock signal from an incoming digital data stream, said clock recovery apparatus comprising:

a voltage-controlled oscillator responsive to a control signal for generating a variable-frequency clock signal;

delay means connected in series with said digital data stream, said delay means being responsive to said control signal for selectively delaying said digital data stream to generate a delayed data stream;

a phase detector responsive to said delayed data stream and to said clock signal for generating an error signal indicative of the phase difference between said delayed data stream and said clock signal; and a loop amplifier and filter responsive to said error signal for generating said control signal.

12. Phase-locked loop clock recovery apparatus according to claim 11 wherein said delay means comprises a voltage-controlled phase shifter.

13. Phase-locked loop clock recovery apparatus according to claim 11 wherein said loop amplifier and filter includes an integrator with a transfer function that does not include an explicit zero.

14. Phase-locked loop clock recovery apparatus for recovering a clock signal from an incoming digital data stream, said clock recovery apparatus comprising:

a voltage-controlled oscillator responsive to a control signal for generating said clock signal;

a voltage-controlled phase shifter responsive to said control signal for delaying said digital data stream for a selected time duration to produce a delayed digital data stream;

a phase detector responsive to said delayed digital data stream and to said clock signal for generating an error signal indicative of the phase difference between said delayed digital data stream and said clock signal; and an amplifier and filter circuit including an integrator, said amplifier and filter circuit having a transfer function that has a single pole, said amplifier and filter circuit being responsive to said error signal for generating said control signal.

15. Phase-locked loop clock recovery apparatus according to claim 14 wherein said amplifier and filter transfer function does not include an explicit zero.

16. Apparatus for recovering a clock signal from a data signal, comprising:
a controlled phase shifter, receiving the data signal and a control signal, for phase shifting the data signal in an amount controlled by the control signal to produce a first signal; and
a phase-locked loop, responsive to the first signal, for producing the control signal.

17. Apparatus according to claim 16 wherein said phase-locked loop comprises:
a controlled oscillator, responsive to the control signal, for producing an oscillating signal whose frequency is determined by the control signal;
a phase detector, responsive to the first signal and the oscillating signal, for producing a second signal indicative of any phase difference between the first signal and the oscillating signal; and
filter means, responsive to the second signal, for producing the control signal.

* * * * *

UNITED STATES PATENT AND TRADEMARK OFFICE
CERTIFICATE OF CORRECTION

PATENT NO. : 5,036,298

DATED : July 30, 1991

INVENTOR(S) : John Bulzacchelli

It is certified that error appears in the above-identified patent and that said Letters Patent is hereby corrected as shown below:

On the Title page, item [75], change "John F. Bulzachelli" to -- John F. Bulzacchelli.

Signed and Sealed this

Twenty-fifth Day of May, 1993

Attest:

MICHAEL K. KIRK

*Attesting Officer*     *Acting Commissioner of Patents and Trademarks*